(12) United States Patent
Sadjadi et al.

(10) Patent No.: US 6,495,470 B2
(45) Date of Patent: *Dec. 17, 2002

(54) CONTACT AND VIA FABRICATION TECHNOLOGIES

(75) Inventors: S. M. Reza Sadjadi, San Jose, CA (US); Mansour Moinpour, Cupertino, CA (US); Te Hua Lin, Los Gatos, CA (US); Farhad K. Moghadam, Los Gatos, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/580,532

(22) Filed: Dec. 29, 1995

(65) Prior Publication Data

US 2002/0031901 A1 Mar. 14, 2002

Related U.S. Application Data

(63) Continuation of application No. 08/342,232, filed on Nov. 18, 1994, now abandoned.

(51) Int. Cl.[7] .............................................. H01L 21/461
(52) U.S. Cl. ........................ 438/738; 438/713; 438/640; 438/638
(58) Field of Search ................................ 438/597, 622, 438/637, 638, 639, 640, 675, 672, 737, 738, 713

(56) References Cited

U.S. PATENT DOCUMENTS

| 5,037,777 A | * | 8/1991 | Mele et al. ................... 438/783 |
| 5,094,900 A | | 3/1992 | Langley ....................... 428/131 |
| 5,174,825 A | | 12/1992 | Yamamoto et al. .......... 156/643 |
| 5,216,281 A | | 6/1993 | Butler |
| 5,246,883 A | * | 9/1993 | Lin et al. ....................... 216/18 |
| 5,262,662 A | | 11/1993 | Gonzalez et al. |
| 5,286,674 A | * | 2/1994 | Roth et al. ..................... 437/95 |
| 5,332,924 A | | 7/1994 | Kobayashi ................... 257/760 |
| 5,338,700 A | * | 8/1994 | Dennison et al. |
| 5,362,666 A | * | 11/1994 | Dennison ....................... 437/52 |
| 5,408,130 A | | 4/1995 | Woo et al. .................... 257/758 |
| 5,482,894 A | * | 1/1996 | Havemann |

FOREIGN PATENT DOCUMENTS

| JP | 1114071 | 5/1989 |
| JP | 401135044 A | 5/1989 |

* cited by examiner

Primary Examiner—Tuan H. Nguyen
(74) Attorney, Agent, or Firm—Blakely, Sokoloff, Taylor & Zafman LLP (57) ABSTRACT

A method of forming a contact opening between two conductive features over a semiconductor substrate. Oxide spacers are formed adjacent to the conductive features. A doped oxide layer is then deposited over the semiconductor substrate. Finally, the contact opening is etched through the doped oxide layer between the conductive features such that the oxide spacers are exposed within the contact opening.

21 Claims, 6 Drawing Sheets

CONTACT AND VIA FABRICATION TECHNOLOGIES

This is a continuation of application Ser. No. 08/342,232, filed Nov. 18, 1994, now abandoned.

FIELD OF THE INVENTION

The present invention relates to semiconductor processing and more particularly to a method of forming contacts and vias for semiconductor devices.

BACKGROUND OF THE INVENTION

As the demand for cheaper, faster, lower power consuming integrated circuits increases, so must the device packing density of the integrated circuit (IC). Minimizing transistor dimensions is of paramount importance to the advancement of semiconductor technologies. Minimizing transistor dimensions allows more transistors to be formed in a given area. Minimizing the dimensions also allows the transistors to operate at higher speeds. The ability to place more high speed transistors in an IC allows more complex and sophisticated functionality to be incorporated into the IC device. Therefore, as a result of reducing the size of transistors in an IC, and improving the speed of the IC, products which use these IC's, such as, for example, home computers, will be able to operate faster and with greater functionality than ever before.

Increasing the device packing density of an IC by minimizing transistor dimensions inherently requires that the interconnect technology used to couple transistors together be similarly minimized. In a typical interconnect technology scheme, after transistors are formed on a semiconductor substrate, a layer of dielectric material is used to coat the surface of the transistors to physically and electrically insulate them. Once this dielectric material is deposited, openings are etched through the dielectric material to the underlying semiconductor substrate. Conductive material is deposited into these openings in order to make electrical contact to the substrate surface. These openings filled with conductive material are called contacts.

Once a first layer of interconnects has been deposited on the surface of the first dielectric layer, a second dielectric layer is deposited to coat the surface of this first interconnect layer. Openings are then etched into this second dielectric layer to permit electrical coupling to the first interconnect layer by filling these openings with conductive material. These openings filled with conductive material are called vias. Once the interconnects of the second interconnect layer have been formed, a third dielectric layer is deposited to coat the second interconnect layer, and vias are again formed in the third dielectric layer. This process of forming an interconnect layer, coating with a dielectric layer, forming vias in the dielectric layer, and forming another interconnect layer on its surface may be repeated any number of times in IC manufacturing technology.

The dimensions of these contacts and vias have historically been limited by the photolithographic technology used to define the size and location of contact and via openings. For example, conventional photolithographic technologies are currently capable of defining, or "resolving", an opening having a minimum width of approximately 0.4–0.5 microns. This minimum resolvable dimension significantly limits the device packing density of the IC.

For example, since contact openings cannot be smaller than 0.4 microns, transistors cannot be spaced any closer than this minimum resolvable dimension or else the contact opening will be etched through a transistor, destroying it. Furthermore, since the accuracy in aligning a contact opening to an underlying semiconductor substrate region between two transistors is imprecise, transistors must be spaced far enough apart to account for any potential misalignment of the contact opening. In addition, some practitioners make contact openings wider than the minimum resolvable dimension because it is difficult to fill such small contact openings with conductive material. Therefore, to account for enlarged and misaligned contact openings, transistors may ultimately be spaced as far as 1 micron apart from each other, lowering the transistor packing density of the IC.

While more advanced and complex photolithographic technologies have been developed to resolve smaller dimensions, these advanced technologies are expensive, typically unreliable, and currently unmanufacturable. What is needed, then, is a manufacturable process whereby contacts and vias can be formed having widths less than the minimum resolvable dimension of the photolithographic technology employed to define the openings.

SUMMARY OF THE INVENTION

A method is described for forming a contact opening between two conductive features over a semiconductor substrate. Oxide spacers are formed adjacent to the conductive features. A doped oxide layer is then deposited over the semiconductor substrate. Finally, the contact opening is etched through the doped oxide layer between the conductive features such that the oxide spacers are exposed within the contact opening.

DETAILED DESCRIPTION

A novel method for forming very narrow contact and via openings is described. In the following description numerous specific details such as layer thicknesses, process sequences, material compositions, etc., are set forth in order to provide a more thorough understanding of the present invention. However, it will be obvious to one skilled in the art that the present invention may be practiced without employing these specific details. In other instances, wellknown processes and processing techniques have not been described in detail in order to avoid unnecessarily obscuring the present invention.

While diagrams representing various embodiments of the present invention are illustrated in FIGS. 1a–3d, these illustrations are not intended to limit the invention. The specific processes described herein are only meant to help clarify an understanding of the present invention and to illustrate embodiments of how the present invention may be implemented in order to form contact and via openings in accordance with the present invention. For the purposes of this discussion, a semiconductor substrate is a substrate comprising any material or materials used in the manufacture of a semiconductor device. A substrate is a structure on which or to which a processing step acts upon.

Figure 1A:
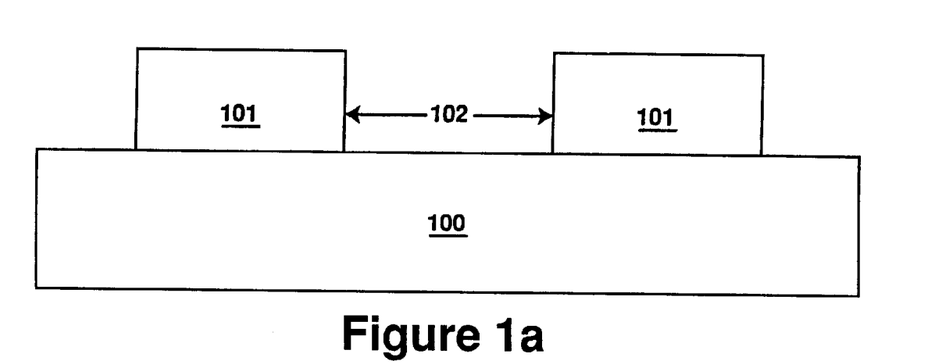
FIG. 1a is an illustration of a cross-sectional view of a semiconductor substrate having two conductive features formed thereon.

In accordance with the present invention polysilicon gate electrodes 101 are formed on the surface of a semiconductor substrate 100 as illustrated in FIG. 1a. These polysilicon gate electrodes 101 are used to control the voltage applied to the gates of metal-oxide-semiconductor (MOS) transistors. Polysilicon gate electrodes 101 are spaced as close together as the photolithographic technology will permit in order to fit as many transistors on the IC as possible, increasing the device packing density of the IC. Therefore, distance 102 between the two polysilicon gate electrodes 100 is approximately equal to the minimum resolvable distance of the photolithographic technology employed to define polysilicon gate electrodes 101. However, note that distance 102 should also be wide enough to enable all features of the respective transistors, such as, for example, spacers (described below) to be formed. In currently available IC manufacturing technologies, distance 102 is in the range of approximately 0.4–0.5 microns, but may be reduced as manufacturing technologies advance.

In an alternate embodiment, polysilicon gate electrodes 101 are replaced by other conductive features. Such conductive features may include, for example, a dual layer polysilicon structure such as those formed in accordance with erasable programmable read-only memory (EPROM) devices. Alternatively, these conductive features may comprise conductive materials other than polysilicon, such as, for example, metallic films and their silicides which may be formed in conjunction with IC manufacturing technologies. Note that the conductive features need not be entirely conductive. For example, dielectric films such as gate oxides, diffusion barriers, and other protective layers, may be incorporated into the conductive features.

Figure 1B:
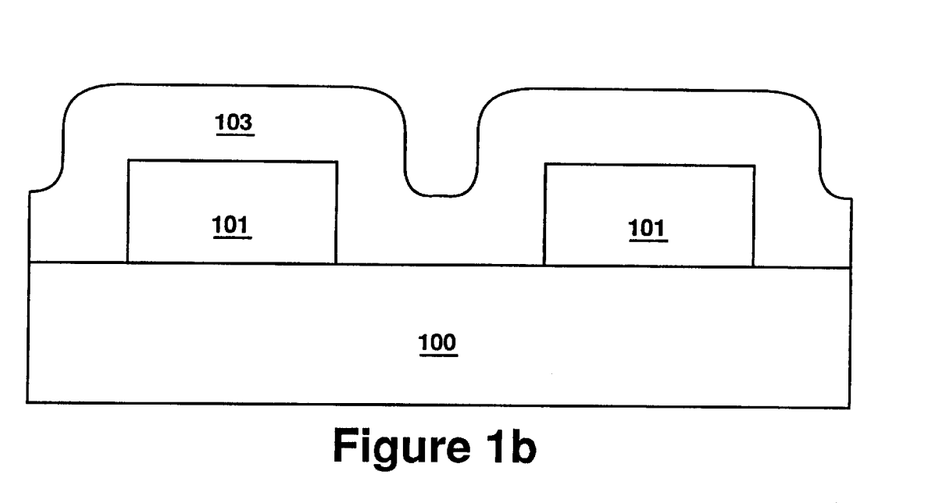
FIG. 1b is an illustration of a cross-sectional view of the semiconductor substrate of FIG. 1a after a first layer has been deposited.

FIG. 1b illustrates the semiconductor substrate of FIG. 1a after a conformal silicon dioxide (oxide) layer 103 has been deposited. In accordance with the present invention, oxide layer 103 is deposited using an undoped tetraethyl orthosilicate (TEOS) chemistry capable of highly conformal oxide depositions. The thickness of oxide film 103 is in the range of approximately 0.1–0.2 microns, however the actual thickness depends on the architecture of the IC device. Therefore, as manufacturing technologies advance, this thickness may be appropriately reduced.

Alternatively, oxide layer 103 may be deposited by a chemistry other than TEOS, such as, for example, silane. Oxide layer 103 may be deposited by a thermal chemical vapor deposition (THCVD), plasma enhanced CVD (PECVD), or any other type of CVD process. An important consideration in selecting the type of chemistry and deposition process used to form oxide layer 103 is improving the conformality of the layer. In an alternate embodiment, oxide layer 103 may comprise a small amount of dopant material to form a lightly doped borosilicate glass (BSG), a lightly doped phosphosilicate glass (PSG), or an oxide layer comprising an alternate type of impurity.

Fortunately, the semiconductor manufacturing industry has developed many inexpensive, highly manufacturable oxide formation technologies which may be employed in conjunction with the formation of oxide layer 103. In spite of these well characterized oxide formation technologies, the semiconductor industry has heretofore been attempting to implement a less manufacturable, more expensive process of forming a silicon nitride (nitride) layer in place of oxide layer 103 for subsequent creation of nitride spacers. In addition to being less manufacturable and more expensive, the so-called nitride spacer technology has also been plagued by the inherent non-conformalities of nitride films. These nitride film non-conformalities, manifested as nitride cusping, result in retrograde spacer profiles which can negatively impact the minimum allowable spacing 102 between conductive features. Nitride spacers have also caused device degradation for certain applications such as EPROM technologies due to charge retention limitations. Notwithstanding the problems associated with nitride spacer technology, the semiconductor industry has focused development efforts into this technology under the notion that oxide spacer technologies cannot provide the etch selectivity necessary for the formation of suitably narrow contact openings. What Applicants have discovered is that oxide spacer technology can indeed be employed in conjunction with contact and via fabrication processes.

Figure 1C:
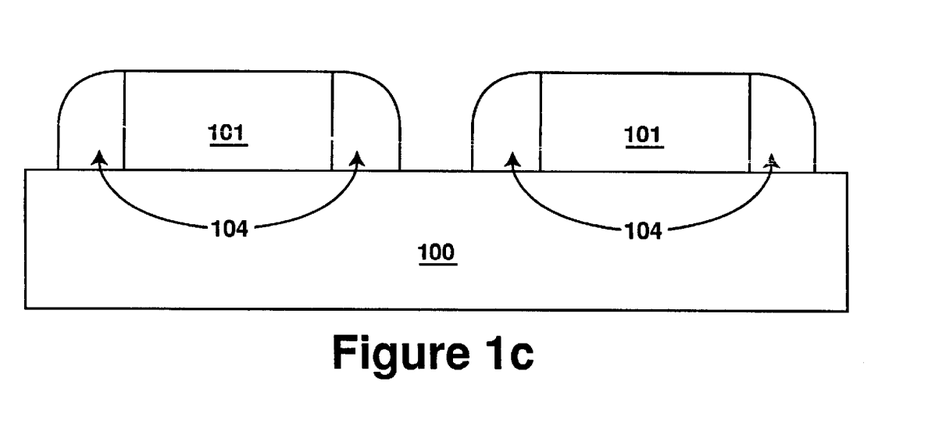
FIG. 1c is an illustration of a cross-sectional view of the semiconductor substrate of FIG. 1b after the first layer has been anisotropically etched back.

The thickness of oxide film 103 determines the approximate width of spacers to be formed from oxide layer 103. FIG. 1c illustrates the semiconductor substrate of FIG. 1b after an anisotropic etch has been performed to etch back oxide layer 103, forming spacers 104. The width of each of spacers 104 is approximately equal to the thickness of oxide layer 103. Therefore, the thickness of oxide layer 103 should be less than one-half the distance 102 so that the spacers between polysilicon gate electrodes 101 do not merge into each other. In addition, there must be a certain amount of space available between the spacers formed in the region between polysilicon gate electrodes 101 to facilitate, for example, a source/drain implant into semiconductor substrate 100. Also, the spacers must accommodate the subsequent formation of a contact opening in the region between the polysilicon gate electrodes.

Spacers 104 must be wide enough to protect the sides of polysilicon gate electrodes 101 from both contamination and any possible contact with a conductive material subsequently deposited within a contact opening formed between the spacers. On the other hand the width of spacers 104 must be narrow enough to permit adequate formation of source/drain regions between the spacers. Also, spacers 104 must be narrow enough to allow sufficient electrical contact between the conductive material used to fill the contact opening formed between the spacers and the underlying semiconductor substrate 100. For example, in one embodiment, the thickness of oxide layer 103 is in the range of approximately 0.05 microns to ½ the distance 102 between polysilicon gate electrodes 101.

Figure 1D:
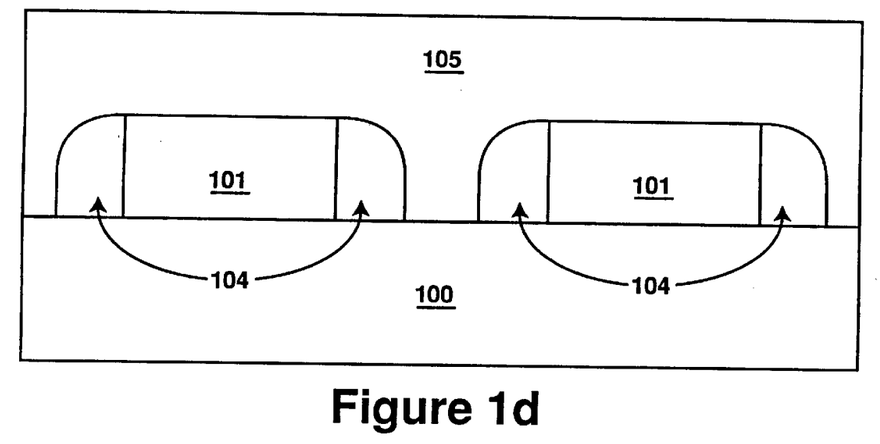
FIG. 1d is an illustration of a cross-sectional view of the semiconductor substrate of FIG. 1c after a second layer has been deposited.

FIG. 1d illustrates the substrate of FIG. 1c after a borophosphosilicate glass (BPSG) dielectric layer 105 has been formed and planarized. BPSG layer 105 serves to protect and electrically insulate adjacent conductive regions from each other. After BPSG layer 105 has been deposited, the surface of BPSG layer 105 is planarized using a chemical mechanical polishing technique. Alternatively, layer 105 may comprise other doped films such as, for example, heavily doped BSG or PSG films or other oxide films comprising alternate impurities. Also, BPSG layer 105 may be planarized by a reflow process which may be followed by an etch back step, or other planarization techniques.

Figure 1E:
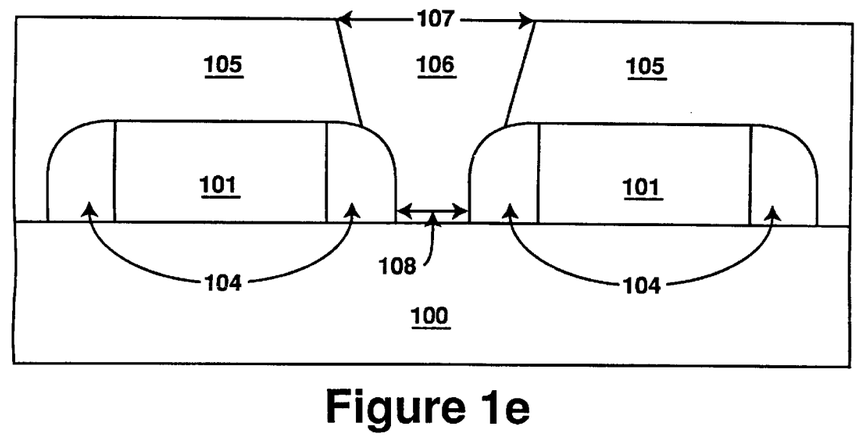
FIG. 1e is an illustration of a cross-sectional view of the semiconductor substrate of FIG. 1d after a contact opening has been formed in accordance with the present invention.

FIG. 1e illustrates the substrate of FIG. 1d after a contact opening has been formed in accordance with the present invention. The location of contact opening 106 is defined using photolithographic techniques. When properly aligned, contact opening 106 will be centered between polysilicon gate electrodes 101 as illustrated. In a dry etch process, contact opening 106 is formed using etch chemistries having a higher degree of selectivity to undoped oxide than to doped oxide. In this manner, the heavily doped BPSG layer 105 is removed from contact opening 106 more rapidly than spacers 104. As a result, the lower portion of contact opening 106 is effectively self-aligned to the space between oxide spacers 104 as illustrated. Etch chemistries based on $CHF_3$, $CF_4$, $N_2$, and Ar combinations may be used, however the particular etch chemistry employed depends on the type of doping and dopant concentration in the dielectric films to be etched. In addition, note that the contact opening etch process may comprise multiple steps using multiple etch chemistries.

Therefore, even if the location of contact opening 106 is slightly misaligned during the photolithographic step, spacers 104 will prevent polysilicon gate electrodes 101 from being exposed within contact opening 106. If exposed, polysilicon gate electrodes 101 would come into contact with a conductive material subsequently deposited within contact opening 106, destroying the transistor. In addition, since width 108 at the lower portion of contact opening 106 is defined by the distance between spacers 104, width 108 in this critical region of the contact opening is defined by the spacer width rather than the photolithographic technology employed. In other words, width 108 at the bottom of contact opening 106 may be modulated by adjusting the thickness of oxide layer 103, thereby adjusting the width of spacers 104 as described above. In accordance with the present invention, width 108 near the bottom of contact opening 106 is less than the minimum resolvable dimension of the photolithographic technology used to define the contact opening. As a result, the present invention may be employed to form ultra-narrow contact widths using relatively inexpensive, manufacturable, commercially available semiconductor processing tools.

In a particular embodiment, spacing 102 between polysilicon gate electrodes 101 is 0.5 microns, and the width of each of spacers 104 is approximately 0.15 microns. In this embodiment, the width 108 at the bottom of contact opening 106 can ideally be calculated to be 0.2 microns. This determination of width 108 assumes that an ideal etch chemistry is used to etch contact opening 106 having a sufficiently high selectivity to undoped or lightly doped spacer 104 compared to BPSG layer 105. In actual practice, however, a portion of spacers 104 exposed on each laterally opposing sidewall within contact opening 106 is slightly etched back by the etch chemistry used to etch the contact opening. So, in actuality, width 108 at the bottom of contact opening 106 is slightly larger than 0.2 microns in this embodiment. However, the overall tapered profile of contact opening 106, wherein width 107 at the top of the contact opening is wider than width 108 at the bottom of the contact opening is maintained. In an alternate embodiment where more advanced manufacturing technologies are employed, more narrow spacings may be implemented as described above. In general, etch selectivities of greater than approximately 10:1 may be employed in accordance with the present invention to form suitably tapered contact and via openings.

This tapered contact opening profile formed in accordance with the present invention is an important feature. It is desirable for contact openings to be tapered because tapering a contact opening effectively lowers the aspect ratio (height/width) of the contact opening. As the aspect ratio of a contact opening decreases, the ease with which a practitioner may subsequently fill the contact opening with a conductive material proportionately increases. Therefore, the present invention may be used not only to minimize the width of a contact opening below photolithographic limitations but also to taper a contact opening thereby improving a practitioner's ability to subsequently fill the contact opening with conductive material.

Figure 2A:
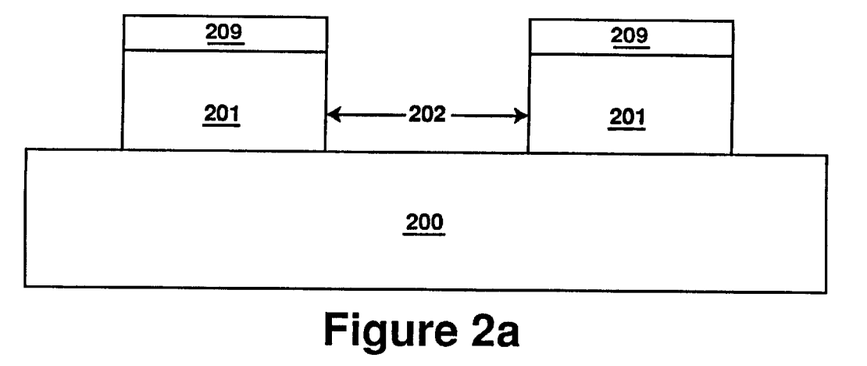
FIG. 2a is an illustration of a cross-sectional view of a semiconductor substrate including two conductive features with cap oxides formed thereon.

FIGS. 2a–e illustrate a particular embodiment of the present invention which facilitates additional tapering of the profile of the contact opening formed in accordance with the present invention. FIG. 2a illustrates a semiconductor substrate 200 upon which polysilicon gate electrodes 201 have been formed a distance 202 apart. A cap oxide layer 209 has been formed over each polysilicon gate electrode 201. Cap oxide layer 209 is formed by low temperature oxide (LTO) deposition of an undoped or lightly doped oxide on the surface of the polysilicon layer from which polysilicon gate electrodes 201 are subsequently formed. In this manner, cap oxide layers 209 are self-aligned to the edges of polysilicon gate electrodes 201 since both are etched using the same mask.

Alternatively cap oxide layer 209 may be formed by other deposition methods utilizing an oxide forming chemistry such as, for example, TEOS. In an alternate embodiment, cap oxide layer 209 comprises a lightly doped BSG or PSG oxide film. Also, cap-oxide layer 209 may be formed by thermal oxidation of the underlying polysilicon material either before or after etching the polysilicon material.

Figure 2B:
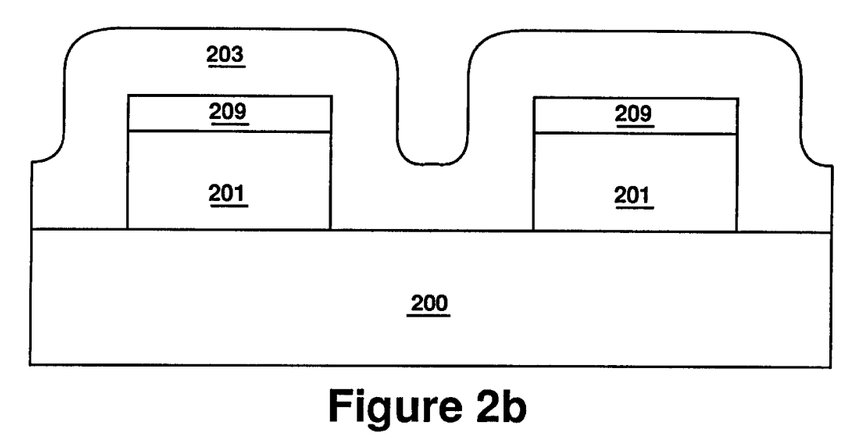
FIG. 2b is an illustration of a cross-sectional view of the semiconductor substrate of FIG. 2a after a first layer has been deposited.

FIG. 2b illustrates the substrate of FIG. 2a after an undoped or lightly doped oxide layer 203 has been formed in accordance with the present invention. Oxide layer 203 is conformally deposited over the surface of semiconductor substrate 200, substantially coating polysilicon gate electrodes 201 and cap oxide layer 209.

Figure 2C:
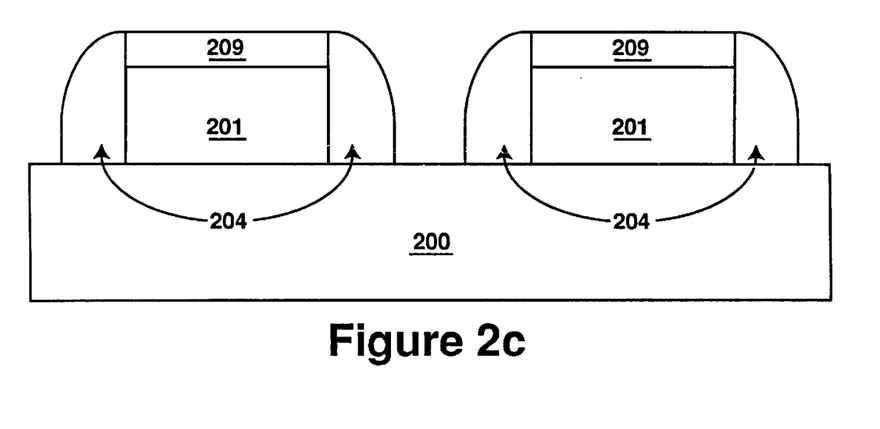
FIG. 2c is an illustration of a cross-sectional view of the semiconductor substrate of FIG. 2b after the first layer has been anisotropically etched back.

FIG. 2c illustrates the substrate of FIG. 2b after oxide layer 203 has been anisotropically etched back. By anisotropically etching back oxide layer 203, spacers 204 are formed. As discussed above, the width of spacers 204 is approximately equal to the deposited thickness of oxide layer 203.

Figure 2D:
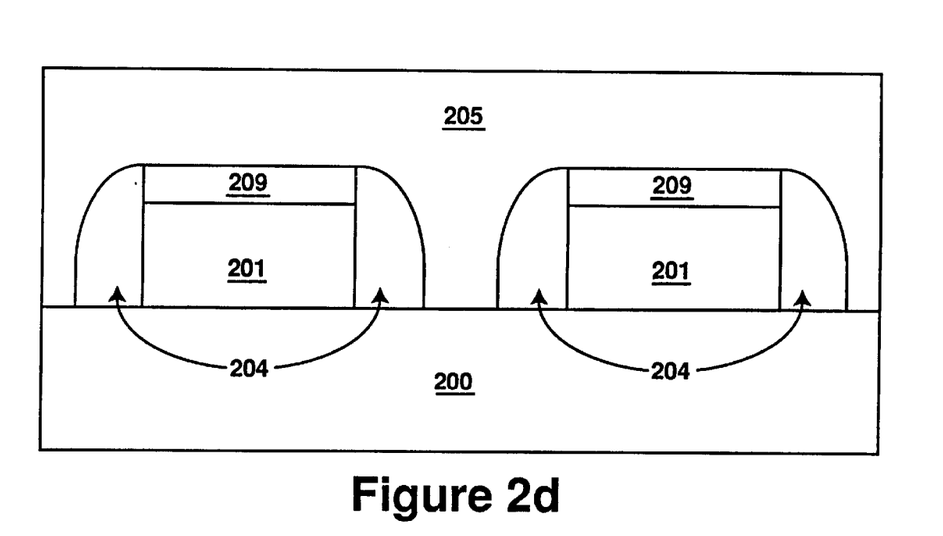
FIG. 2d is an illustration of a cross-sectional view of the semiconductor substrate of FIG. 2c after a second layer has been deposited.

FIG. 2d illustrates the substrate of FIG. 2c after a BPSG layer 205 has been deposited and planarized by chemically mechanically polishing the surface of layer 205. As described above, BPSG layer 205 may alternatively be planarized by a reflow process which may be followed by an etch back process step or planarized using other techniques.

Figure 2E:
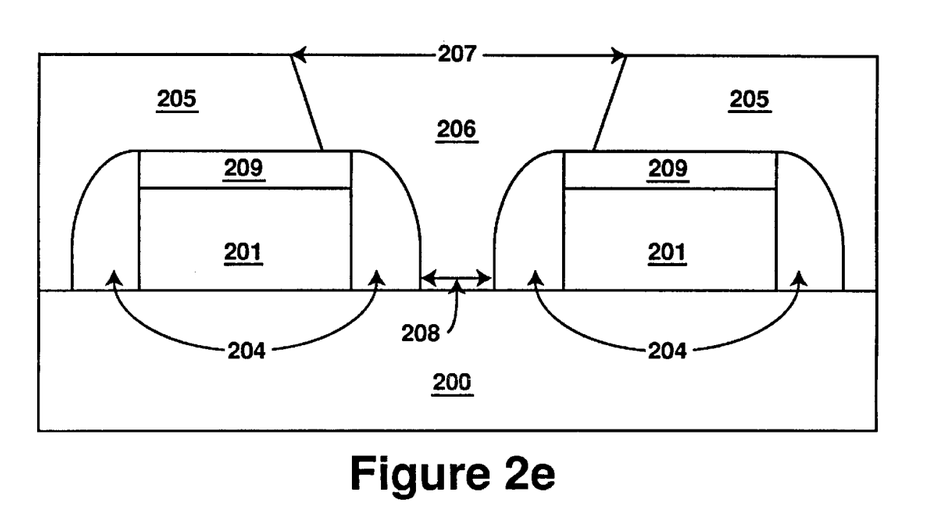
FIG. 2e is an illustration of a cross-sectional view of the semiconductor substrate of FIG. 2d after a contact opening has been formed in accordance with the present invention.

FIG. 2e illustrates the substrate of FIG. 2d after a contact opening 206 has been formed in accordance with the present invention. Note that while width 208 at the bottom of contact opening 206 is approximately equal to width 108 at the bottom of contact opening 106 of FIG. 1e, width 207 at the top of contact opening 206 is significantly wider than width 107. Photolithographic techniques are used to define width 207 at the top of contact opening 206 to be wider than the minimum dimension the photolithographic technology is capable of resolving. As described above, the dry etch chemistry used to etch contact opening 206 has a higher degree of selectivity to undoped oxide than to doped oxide. Therefore, BPSG material 205 is etched more rapidly from the region within contact opening 206 than either spacers 204 or cap-oxide 209. Both cap oxide layer 209 and spacers 204 remain relatively intact, preventing any conductive material deposited within contact opening 206 from contacting polysilicon gate electrodes 201.

However, as described above, some portion of spacers 204 and cap-oxide 209 is slightly etched by this technique. Therefore, it is important that the thickness of spacers 204 and the thickness of capoxide layer 209 be selected such that these oxides prevent the underlying polysilicon gate electrode 201 from being exposed within contact region 206. If any conductive portion of polysilicon gate electrode 201 is exposed within contact region 206, then a subsequently deposited conductive material within contact region 206 will come into contact with the polysilicon gate electrode. This will destroy the transistor.

Because width 207 at the upper portion of contact opening 206 can be formed much wider than the self-aligned lower portion of contact opening 206, the embodiment of the present invention illustrated in FIGS. 2a–e has certain advantages. For example, because the width 207 at the top of contact opening 206 can be defined wider than width 107 at the top of contact opening 106 of FIG. 1e, contact opening 206 is more tolerable to misalignment of its photolithographically defined upper region. In addition, because width 207 at the top of contact opening 206 is wider, the aspect ratio of contact opening 206 is further reduced, thereby improving a practitioners ability to fill contact opening 206 with a conductive material. Note that cap oxide layer 209 additionally serves to protect the underlying polysilicon gate electrode 201 from auto-doping from BPSG layer 205.

Figure 3A:
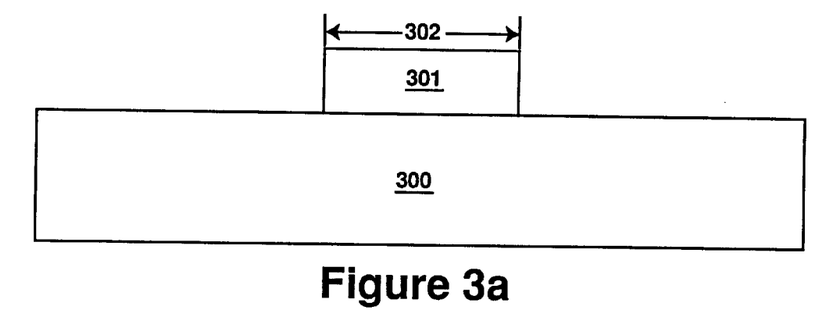
FIG. 3a is an illustration of a cross-sectional view of a semiconductor substrate having a conductive feature formed thereon.

Techniques in accordance with the present invention may also be implemented to form self-tapering via openings as illustrated in FIGS. 3a–d. FIG. 3a illustrates a metal interconnect feature 301 formed over semiconductor substrate 300. The width 302 of metal interconnect 301 is the minimum dimension resolvable by the photolithographic technology employed to define metal interconnect 301.

Figure 3B:
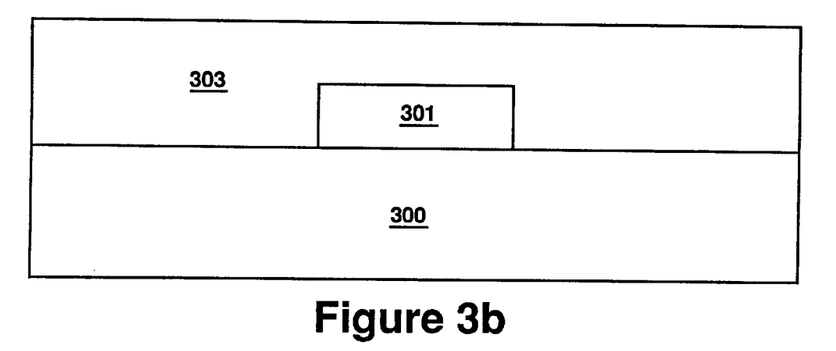
FIG. 3b is an illustration of a cross-sectional view of the substrate of FIG. 3a after a first layer has been deposited and planarized.

FIG. 3b illustrates the substrate of FIG. 3a after a first interlayer dielectric (ILD) layer 303 has been deposited and planarized using chemical mechanical polishing. ILD layer 303 comprises BPSG. As an alternative to the chemical mechanical polishing process for planarization of ILD layer 303, if metal interconnect 301 comprises a suitable, high temperature refractory metal, BPSG layer 303 may be planarized by subjecting the substrate to a high temperature reflow process step which may be followed by an etch back step or other form of planarization. Alternatively, planarization may be performed after depositing a subsequent ILD layer.

Figure 3C:
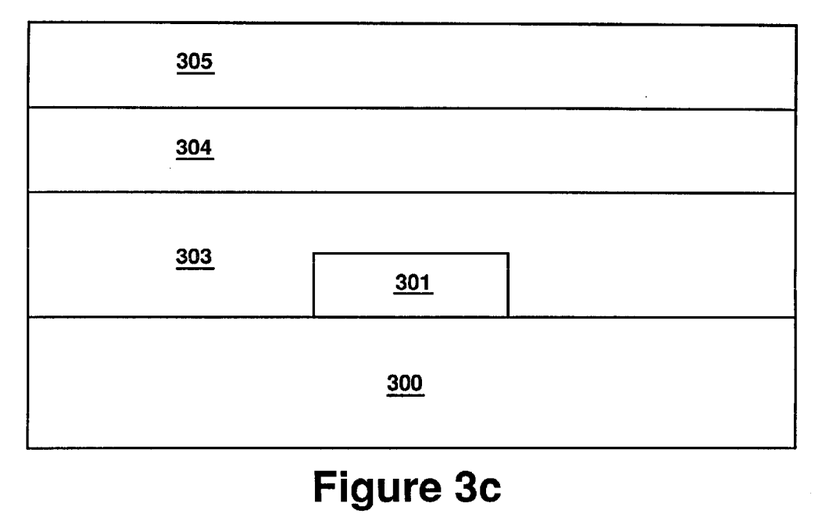
FIG. 3c is an illustration of a cross-sectional view of the substrate of FIG. 3b after a second and third layer has been deposited.

FIG. 3c illustrates the substrate of FIG. 3b after an undoped LTO oxide layer 304 and a second ILD layer 305 have been formed. ILD layer 305 primarily comprises BPSG. Alternatively, oxide layer 304 may be formed by any number of other deposition techniques using an oxide forming chemistry such as, for example, TEOS. Also, in an alternate embodiment, oxide layer 304 comprises a lightly doped BSG or PSG oxide material. In addition, layer 305 may comprise other heavily doped films such as, for example, heavily doped BSG or PSG films.

Figure 3D:
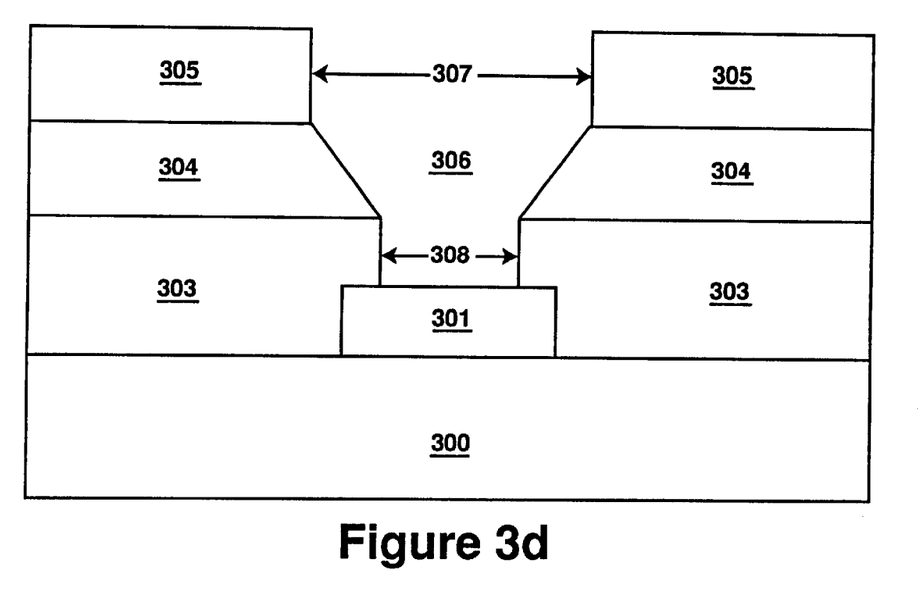
FIG. 3d is an illustration of a cross-sectional view of the substrate of FIG. 3c after a via opening has been formed in accordance with the present invention.

FIG. 3d illustrates the substrate of FIG. 3c after a via opening 306 has been formed in accordance with the present invention. Via opening 306 is formed using a dry etch chemistry having a higher degree of selectivity to undoped oxide than to doped oxide. As such, the etch technique employed rapidly etches through the doped ILD layer 305, substantially aligned to the photolithographic definition of via opening 306. However, when the etch chemistry reaches oxide layer 304, the etch rate slows and the tapered or narrowing sidewall profile illustrated in FIG. 3d results. Once the etch chemistry reaches doped ILD layer 303, the etch rate again increases, resulting in near vertical walls in this lower portion of via opening 306. The etch chemistry used has a selectivity greater than approximately 10:1. Alternatively, a particular etch chemistry may be specifically employed to create this tapered region through oxide layer 304 such as, for example, an etch chemistry having a high tendency to polymerize the sidewalls of via opening 306.

Width 308 at the bottom of via opening 306 is narrower than the minimum resolvable dimension of the photolithographic technology employed to define via opening 306. Width 308 at the bottom of via opening 306 is controlled by proper adjustment of the thickness of oxide layer 304 or adjustment of the etch chemistry used to etch via opening 306. Since width 308 at the bottom of via opening 306 is narrower than width 302 of metal interconnect 301, the embodiment of the present invention illustrated in FIGS. 3a–d can accommodate minor misalignments of the location of via opening 306. Furthermore, since width 308 decreases as the thickness of oxide layer 304 increases, a thicker oxide layer 304 results in a via formation process which is more tolerable to misalignment.

In addition to the alignment advantages associated with the natural tendency of this via formation technique to form a tapered via, the ability to subsequently fill via opening 306 with a conductive interconnect material is improved. First, since width 307 at the top of via opening 306 may be formed wider than the minimum dimension the photolithographic technology is capable of resolving, the aspect ratio is reduced compared to a minimum sized via. Second, the tapered profile of via opening 306 is easier to fill than a vertical via. However, note that while increasing the thickness of oxide layer 304 improves the alignment tolerance of via opening 306, it also increases the aspect ratio of via opening 306, thereby frustrating subsequent deposition of conductive material within the via opening.

Thus a process for forming contact and via openings is described. In accordance with the present invention, contacts and vias may be formed having ultra-narrow widths.

What is claimed is:

1. A method of forming a via opening to expose a portion of a metal interconnect, said method comprising:

a) depositing a first interlayer dielectric (ILD) layer over said portion of said metal interconnect, said first ILD layer comprising BPSG;

b) depositing an oxide layer over said first ILD layer, said oxide layer comprising a material selected from the group consisting of undoped oxide, lightly doped BSG, lightly doped PSG, and any combination thereof;

c) depositing a second ILD layer over said oxide layer, said second ILD layer comprising BPSG; and d) dry etching said via opening through said second ILD layer, said oxide layer, and said first ILD layer to said portion of said metal interconnect using a single etch chemistry which causes a narrowing of said via opening through said oxide layer such that a width of said via opening in said first ILD layer is narrower than a width of said via opening in said second ILD layer.

2. The method of claim 1 further comprising planarizing said first ILD layer using a chemical mechanical polish before depositing said oxide layer.

3. The method of claim 1 wherein said etch chemistry has a higher degree of selectivity to undoped oxide than to doped oxide.

4. A method comprising:

forming a first BPSG layer over a portion of a substrate;

forming an oxide layer over the first BPSG layer, the oxide layer comprising a material selected from a group comprising undoped oxide, lightly doped BSG, lightly doped PSG, and any combination thereof;

forming a second BPSG layer over the oxide layer; and dry etching an opening through the second BPSG layer, the oxide layer, and the first BPSG layer to the substrate using a single etch chemistry that causes a narrowing of the opening through the oxide layer such that a width of the opening in the first BPSG layer is narrower than a width of the opening in the second BPSG layer.

5. The method of claim 4 further comprising planarizing the first BPSG layer using a chemical mechanical polish before depositing the oxide layer.

6. The method of claim 4 wherein the etch chemistry has a higher degree of selectivity to undoped oxide than to doped oxide.

7. The method of claim 4 wherein the opening is a via.

8. The method of claim 7 wherein the substrate includes a metal interconnect.

9. The method of claim 4 wherein the opening is a contact.

10. A method comprising:

forming a first layer over a substrate, the first layer containing dopants;

forming a second layer over the first layer the second layer containing fewer dopants than the first layer;

forming a third layer over the second layer, the third layer being more heavily doped than the second layer; and dry etching an opening through the first, second, and third layers using a single etch chemistry that causes a narrowing of the opening through the second layer such that a width of the opening in the first layer is narrower than a width of the opening in the third layer.

11. The method of claim 10 further comprising planarizing the first layer using a chemical mechanical polish before depositing the second layer.

12. The method of claim 10 wherein the first, second, and third layers are oxide layers.

13. The method of claim 12 wherein the etch chemistry has a higher degree of selectivity to undoped oxide than to doped oxide.

14. The method of claim 10 wherein the opening is a via or contact.

15. The method of claim 14 wherein the substrate includes an interconnect.

16. The method of claim 10 wherein the first and third layers include BPSG.

17. The method of claim 16 wherein the second layer includes undoped oxide, BSG, or PSG.

18. A method comprising:

forming a first layer over a substrate;

forming a second layer over the first layer;

forming a third layer over the second layer; and dry etching an opening through the first, second, and third layers using a single etch chemistry that causes a narrowing of the opening through the second layer such that a width of the opening in the first layer is narrower than a width of the opening in the third layer.

19. The method of claim 18 further comprising planarizing the first layer using a chemical mechnanical polish before depositing the second layer.

20. The method of claim 18 wherein the opening is a via or contact.

21. The method of claim 18 wherein the substrate includes an interconnect.

* * * * *